United States Patent [19]
Bhatia et al.

[11] 3,987,216
[45] Oct. 19, 1976

[54] METHOD OF FORMING SCHOTTKY BARRIER JUNCTIONS HAVING IMPROVED BARRIER HEIGHT

[75] Inventors: Harsaran Singh Bhatia; Harry Charles Calhoun, both of Wappingers Falls; Robert Leonard Melhado, Poughkeepsie; Randolph Huff Schnitzel, Newburgh, all of N.Y.

[73] Assignee: International Business Machines Corporation, Armonk, N.Y.

[22] Filed: Dec. 31, 1975

[21] Appl. No.: 645,766

[52] U.S. Cl. .................................. 427/84; 29/590; 357/15; 427/86; 427/91; 427/125; 427/374 R; 427/398 R
[51] Int. Cl.² .................................................. B05D 5/12
[58] Field of Search ................ 427/84, 91, 374, 86, 427/383, 125, 398; 357/15; 29/589, 590

[56] References Cited
UNITED STATES PATENTS

| | | | |
|---|---|---|---|
| 3,382,568 | 5/1968 | Kuiper | 29/589 |
| 3,413,157 | 11/1968 | Kuiper | 29/589 |
| 3,424,627 | 1/1969 | Michel et al. | 427/84 |
| 3,555,669 | 1/1971 | Tarn | 29/589 |
| 3,725,309 | 4/1973 | Ames et al. | 29/590 |
| 3,780,320 | 12/1973 | Dorler et al. | 357/15 |
| 3,924,264 | 12/1975 | Dorler et al. | 357/15 |
| 3,935,586 | 1/1976 | Landheer et al. | 357/15 |

*Primary Examiner*—Cameron K. Weiffenbach
*Attorney, Agent, or Firm*—James M. Thomson

[57] ABSTRACT

A method is disclosed for forming Schottky barrier junctions having improved barrier height characteristics. The method involves the use of a layer of polysilicon deposited upon the Schottky metal prior to sintering. The polysilicon layer acts as a source from which silicon is diffused into the metal during the sintering operation. After sintering the junction is quenched or cooled at a rapid rate whereby outdiffusion of the silicon is prevented.

6 Claims, No Drawings

METHOD OF FORMING SCHOTTKY BARRIER JUNCTIONS HAVING IMPROVED BARRIER HEIGHT

BACKGROUND OF THE INVENTION

1. Field of the Invention

The present invention relates to a method of fabrication of Schottky barrier diodes. More particularly, the invention concerns an improved method of fabricating Schottky barrier junctions having improved barrier height characteristics.

2. Description of the Prior Art

The use of Schottky barrier junctions is well known in the prior art. Thus, a Schottky barrier junction is formed as a rectifying metal-semiconductor junction produced by plating, evaporating or sputtering any of a variety of metals on N-type or P-type semiconductor materials. The commonly used metals are the electrode metals such as molybdenum, tungsten, aluminum, hafnium or aluminum alloyed with copper and the semiconductor most commonly utilized is silicon. The electrical characteristics of such metal to semiconductor junctions are well known to depend upon the work function of the metal as well as the electron affinity of the semiconductor. Further, the energy necessary for an average electron to float in the reverse direction across the barriers is determined largely by the barrier height of the junction, where the barrier height is found to be equal to the difference in work function between the metal and the semiconductor. From this relationship, it follows that an essential requirement of forming a diode junction is that the work function of the metal must exceed the corresponding property of the semiconductor in order that a barrier be present. If this condition is not met an ohmic contact is formed.

Consequently, in the case of aluminum-copper aloyed material it has been found that Schottky barrier diodes can be formed utilizing N-type silicon having a doping less than $8 \times 10^{16}$ atoms/cu.cm. It is well recognized that tungsten, nickel and molybdenum can be utilized to form Schottky barrier junctions in conjunction with N-type silicon material having the above-mentioned doping; and that hafnium can be utilized with P-type silicon having the above-mentioned doping level to form Schottky barrier junctions.

With the usual aluminum-silicon barrier, a barrier height in the order of 0.68–0.72 electron volts is possible where pure metal exists at the junction after the usual sintering operation employed for faricating the devices.

For many purposes Schottky barrier diodes having a barrier height of 0.68–0.72 electron volts are satisfactory. However, a need exists in the prior art for fabricating Schottky barrier diodes having uniform and significantly increased barrier height.

SUMMARY OF THE INVENTION

Accordingly, it is an object of the present invention to provide an improved method for manufacturing Schottky barrier diodes having improved barrier height characteristics. The method of the invention includes a process step of depositing a layer of polysilicon upon the Schottky metal prior to the usual sintering step in the fabrication of the diode. This polysilicon layer serves as a source or reservoir from which silicon can be diffused into the Schottky metal during the sintering process. Upon completion of the sintering step the Schottky device is cooled at a fast rate whereby outdiffusion of the silicon from the Schottky metal is impeded. Consequently, the Schottky metal of the finished device includes substantial amounts of silicon trapped within the metal structure which results in a different work function and a higher barrier height in the finished devices.

DETAILED DESCRIPTION OF THE INVENTION

Other objects, features and advantages of the invention will become apparent from the following detailed description of one preferred embodiment comprising an aluminum copper alloy-silicon junction having improved barrier height characteristics. In the preferred embodiment, the metal selected was aluminum alloyed with 5° by weight copper. In fabricating the device a silicon substrate of N-type silicon having a doping level less than $8 \times 10^{16}$ atoms/cc is utilized. A layer of silicon dioxide is formed on the upper surface of the silicon by a suitable method, such as by oxidation. Holes are then etched in the silicon dioxide at appropriate junctions locations to expose the silicon in the usual fashion. A layer of aluminum copper alloy is then evaporated upon the upper surface of the substrate filling the holes whereby metal silicon junctions are formed at prescribed locations upon the substrate. A layer of polysilicon semiconductor material is then deposited by a suitable method, such as E-beam evaporation, upon the upper surface of the metal.

The wafer is then sintered (or annealed) at 400°–500° C. for 1 to 2 hours within a suitable environment, such as that produced within a conventional closed furnace with a nitrogen atmosphere. After annealing the wafer is removed from the heating environment and cooled at a predetermined rate greater than 5° C. per second until an ambient or close to room temperature condition of the wafer is attained. The cooling can be achieved by placing the wafer in contact with a heat sink, for example, or by quenching in an artificial atmosphere, such as helium passed through a liquid nitrogen trap. It has been found that aluminum copper-silicon junctions formed by the process described herein will exhibit a barrier height of at least 0.75 electron volts whereas the barrier height attainable according to conventional processes using the same metal and semiconductor materials would range only from 0.68 to 0.72 electron volts.

Table 1

| Sample | Cooling Rate °C./second | Barrier Height electron volts |
|---|---|---|
| 1 | 2–3 | .72–.74 |
| 2 | 5 | .75–.78 |
| 3 | 8 | .79–.81 |
| 4 | 15 | .82–.83 |
| 5 | 20 | .82–.84 |

Table 1 reproduced hereinbefore discloses barrier height characteristics of Schottky barrier diodes utilizing aluminum copper-silicon junctions processed at different cooling rates, in accordance with the process description set forth above. In particular, Table 1 represents data derived from five samples fabricated in accordance with the process described herein, with each sample comprising at least one wafer having in the order of 20 Schottky junctions formed thereon. The junctions were formed of aluminum-copper alloy with an overlying silicon layer deposited upon N type silicon substrates. The barrier height values recorded in the Table represent the range of values obtained when all the junctions were measured.

It is believed that the improved barrier height characteristics of the Schottky diodes is due to the use of the overlying layer of polysilicon semiconductor material, which acts as a source or reservoir from which silicon is diffused into the Schottky metal during the sintering process. When the Schottky metal is saturated or nearly saturated with silicon, the cooling step carried out after sintering tends to prevent outdiffusion of the silicon whereby the finished product comprises a Schottky metal having significant amounts of silicon interspersed therein. This in turn affects the work function of the metal and results in improved barrier height characteristics.

From Table 1, it can be seen that an improvement in barrier height may occur where cooling at a rate as low as 2° to 3° C. per second is practiced. However, it appears from the data represented in the Table that significant improvement is achieved with cooling rates of 5° C. per second and above. Although cooling rates above 20° C. per second were not practiced on samples 1 to 5, other experimentations on similar Schottky barrier junctions has shown that further improvement in barrier height can be attained with cooling rates as high as 50° C. per second.

While the foregoing examples relate to aluminum copper-silicon junctions, it should be recognized that the other known Schottky metals could be utilized with either N-type or P-type silicon to produce Schottky barrier diodes in accordance with the foregoing process which have similarly improved characteristics.

While the invention has been particularly shown and described with reference to the preferred embodiment thereof, it will be understood by those skilled in the art that various changes in form and details may be made therein without departing from the spirit and scope of the invention.

What is claimed is:

1. A method of producing Schottky barrier diodes comprising the steps of:
   depositing a metal layer upon a semiconductor layer wherein the work function of the metal exceeds the work function of the semiconductor material,
   depositing a layer of semiconductor material upon the metal layer;
   heating the semiconductor material and metal to a temperature near the eutectic point of the metal; and
   cooling the metal layer at a rate of at least 5° C. per second until the metal approaches room temperature.

2. The method of claim 1 wherein
   said metal layer comprises aluminum deposited upon an N-type silicon substrate.

3. The method of claim 2 wherein
   said aluminum layer is heated at a temperature between 400° and 500° C. for about 1 hour.

4. The method of claim 1 wherein
   said metal layer is cooled at a rate between 5° and 20° C. per second until said metal reaches room temperature.

5. The method of claim 4 wherein said metal is heated at a temperature of about 400° C. for about 1 hour.

6. A method for forming Schottky barrier diodes comprising the steps of:
   depositing a layer of aluminum copper alloy upon a substrate of N-type silicon having a doping level less than $8 \times 10^{16}$ atoms/cc;
   depositing a layer of polysilicon semiconductor material upon said metal;
   heating said metal layer at a temperature between 400° and 500° C. for 1 to 2 hours; and
   cooling said metal layer at a rate between 5° and 20° C. per second until said metal reaches room temperature.

* * * * *